(12) United States Patent
Gardner et al.

(10) Patent No.: US 6,326,251 B1
(45) Date of Patent: Dec. 4, 2001

(54) METHOD OF MAKING SALICIDATION OF SOURCE AND DRAIN REGIONS WITH METAL GATE MOSFET

(75) Inventors: Mark I. Gardner, Cedar Creek; H. Jim Fulford, Jr., Austin; Thomas E. Spikes, Jr., Round Rock, all of TX (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/290,790

(22) Filed: Jan. 12, 1999

(51) Int. Cl.[7] ............ H01L 21/336; H01L 21/8234
(52) U.S. Cl. .............. 438/197; 438/290; 438/306; 438/307; 438/527; 438/529; 438/585
(58) Field of Search .................... 438/197, 585, 438/586, 592, 290, 305–307, 527, 529, 713, 926, 976

(56) References Cited

U.S. PATENT DOCUMENTS

| | | | |
|---|---|---|---|
| 5,776,821 | * 7/1998 | Haskell et al. ............... | 438/585 |
| 5,780,350 | * 7/1998 | Kapoor ........................ | 438/305 |
| 5,953,633 | * 9/1999 | Chen et al. .................. | 438/683 |
| 5,960,270 | * 9/1999 | Misra et al. ................. | 438/197 |
| 6,103,559 | * 8/2000 | Gardner et al. .............. | 438/183 |
| 6,124,172 | * 9/2000 | Gardner et al. .............. | 438/301 |

* cited by examiner

Primary Examiner—Matthew Smith
Assistant Examiner—Craig P. Lytle
(74) Attorney, Agent, or Firm—Bruce Garlick; James A. Harrison

(57) ABSTRACT

A method of forming a transistor includes forming a source/drain implant in the initial processing stages just after the formation of the isolation and active regions on the substrate. A uniform nitride layer is formed over the surface of the substrate on top of a dielectric layer. A silicide metal is then deposited and reacted with the underlying silicon to form a salicide over the source and drain regions. A second dielectric layer is then formed on top of the salicide and is formed to be selective relative to the nitride layer. Thereafter, the nitride layer is removed and a final gate dielectric is then formed. Finally, a metal gate conductor is formed on top of the gate dielectric. The metal gate conductor is formed only after all annealing steps are performed to prevent the metal from spiking through the gate dielectric thereby ruining the device.

34 Claims, 7 Drawing Sheets

METHOD OF MAKING SALICIDATION OF SOURCE AND DRAIN REGIONS WITH METAL GATE MOSFET

BACKGROUND

1. Field of the Invention

The present invention relates generally to integrated circuit manufacture; and more particularly to a method of manufacture and a structure in which a gate conductor is formed to include a metal contact in a scaled device.

2. Description of the Related Art

The structure and the various components, or features, of a metal oxide semiconductor (MOS) devices are generally well known. A MOS transistor typically includes a substrate material onto which a gate dielectric and a patterned gate conductor are formed. The gate conductor serves to self-align impurities forwarded into the substrate on opposite sides of the gate conductor. The impurities placed into the substrate define a junction region, also known as source and drain regions. The gate conductor typically is patterned from a layer of polysilicon using various lithography techniques.

A typical n-channel MOS transistor employs N-type junctions placed into a P-type substrate. Conversely, a typical p-channel MOS transistor comprises P-type junctions placed into an N-type substrate. The substrate comprises an entire monolithic silicon wafer, of which, a portion of the substrate known as a well exists. The well is doped opposite the substrate so that it can accommodate junctions of an impurity type opposite the junction in the non-well areas. Accordingly, wells are often employed when both N-type and P-type transistors (i.e., Complementary MOS, "CMOS") are needed.

A common trend in modern integrated circuit manufacture is to produce transistors having feature sizes as small as possible. To achieve a high density integrated circuit, features such as the gate conductors, source and drain junctions, and interconnects to the junctions must be made as small as possible. Many modern day processes employ features which have as small as 0.20 microns critical dimensions. As feature sizes decrease, the sizes of the resulting transistors as well as the interconnections between transistors also decrease. Having smaller transistors allows more transistors to be placed on a single monolithic substrate. Accordingly, relatively large circuits can be incorporated on a single and relatively small die area. Further, smaller transistors typically have lower turn-on threshold voltages, faster switching speeds and consume less power in their operation. These features, in combination, allow for higher speed integrated circuits to be constructed that have greater processing capabilities and that produce less heat.

The benefits of high-density circuits can only be realized if advanced processing techniques are used. For example, semiconductor process engineers and researchers often study the benefits of electron beam lithography and xray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another. For example, as the channel length decreases, short channel effects ("SCE") generally occur. SCE cause threshold voltage skews at the channel edges as well as excessive sub threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor. In view of these considerations, certain scaling limits are being reached.

Additional problems result from reducing the channel length in scaled transistors. Because lithography equipment is limited to a smallest dimension, the channel length cannot be made shorter than the smallest dimension using currently known processing steps. Such channel length limitation has heretofore provided a lower limit on the shortest obtainable channel length.

As engineers strive to design devices having minimal size, there also is a continuing need to increase device performance. In general, it is known that metal contacts provide excellent performance in MOSFET devices. Metal often is not used as a gate conductor in scaled devices, however, because of its tendency to spike through the gate dielectric in scaled devices whenever processing techniques include subjecting the wafer to a temperature in excess of 500 degrees Celsius. Because many processing steps typically include subjecting a wafer to a rapid thermal annealing step wherein the temperature exceeds 500 degrees Celsius, conductive polysilicon is formed adjacent to the device gate's oxide layer to carry electrical charge up to the gate oxide instead of metal.

A metal contact is typically used to contact the polysilicon and is formed only in final fabrication steps in which the metallization layers are formed to interconnect the devices on the substrate. Using the polysilicon layer is advantageous as a gate contact material in that it allows the substrate to be subjected to temperatures in excess of 500 degrees Celsius as is common in most annealing process steps.

Devices using polysilicon gate contacts, however, do not perform as efficiently as do devices having metal gate contacts because metal gate contacts provide greater conductivity as compared to polysilicon gate contacts. Additionally, polysilicon gate contacts tend to suffer from poly depletion and boron penetration effects. Accordingly, there is a need for a scaled MOSFET device having metal gate contacts and a need for a process for forming the same.

SUMMARY OF THE INVENTION

The problems outlined above are in large part solved by the transistor formation process according to -the present invention in which a metal gate conductor is deposited and formed after the source and drain regions, lightly doped regions (LDD), gate insulator layers and salicidation layers are formed on the substrate. More specifically, after each doping step to form source and drain regions and LDD regions in the device channels, an annealing step is performed to repair crystalline lattice damage that may result from the ion implantation. Additionally, an annealing step is performed after a silicide metal is formed on the top surface of the substrate as a part of forming salicides to improve device conductivity. Each of these annealing steps can cause metal gate conductors to spike through the gate insulator stack thereby ruining the device. As a result, polysilicon gate conductors that can withstand the aforementioned annealing steps are typically used.

According to the present invention, however, the benefits of metal gate conductors can be realized by forming a metal gate conductor after all of the annealing steps are complete. In order to form the metal gate conductor at the end of the fabrication process, a first selective layer is formed on top of a gate insulator. A second selective layer relative to the first selective layer is formed about the gate stack after the source and drain regions, the LDD regions and the salicidation layer are formed. Accordingly, the first selective layer may then be removed in a selective etch step to create an aperture above the gate insulator to receive and form the metal gate conductor. Once the metal gate conductor is formed, the remaining steps of forming an integrated circuit may be completed. Additionally, by placing the metal gate at the end of the fabrication sequence, salicidation may be performed prior to gate formation thereby eliminating bridging that may occur when using metal gates that are formed prior to annealing steps that are common in salicidation process steps.

These and other aspects of the present invention will become apparent with further reference to the drawings and specification which follow.

BRIEF DESCRIPTION OF THE DRAWINGS

A better understanding of the present invention can be obtained when the following detailed description of the described embodiments is considered in conjunction with the following drawings, in which.

DETAILED DESCRIPTION OF THE DRAWINGS

Figure 1A:
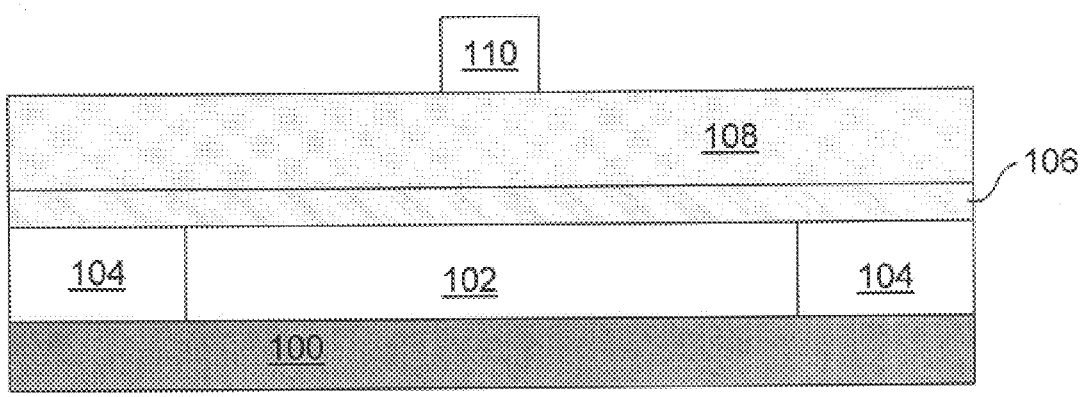
FIGS. 1A through 1D are partial cross-sectional views of a semiconductor substrate illustrating the formation of transistors according to the present invention.

FIGS. 1A through 1D are partial cross-sectional views of a semiconductor substrate illustrating the formation of transistors according to the present invention. Referring now to FIG. 1A, a substrate 100 includes an active region 102 and a plurality of isolation regions 104. In general, FIG. 1A represents a substrate after a first set of steps of forming an integrated circuit as described herein are performed.

The active region 102 is a semiconductive region in which an active device may be formed and is one of a great number of active regions that are formed to create an integrated circuit. The isolation regions 104 are formed of an insulating material that serves to isolate active devices or conductive components from other active devices or conductive components. For silicon-based semiconductor circuits, the isolation regions 104 are typically formed of silicon dioxide.

As is shown herein FIG. 1A, the silicon dioxide is being used to form the isolation regions 104. The isolation regions 104 may be formed using the well known LOCOS growth process, trenching and filling steps or another isolation process. In general, the invention herein includes all forms of creating isolation regions. In at least one embodiment of the invention, the active region 102 is shielded by a mask and remains protected during formation of isolation regions 104. In the described embodiment, active region 102 is doped p-type so that an n-channel device may be formed therein. In an alternate embodiment, however, the active region 102 is doped n-type and a p-channel device is formed therein. As is understood by those skilled in the art, the type of active region 102 results from substrate doping type. If a p-type active region is desired in an n-type wafer, a p-type well will be formed in the wafer.

After the formation of the active and isolation regions 102 and 104, respectively, a dielectric layer 106 is grown or deposited on top of active and isolation regions 102 and 104. The dielectric layer 106 is formed to be an insulator and may be formed out of a thick oxide, a silicon nitride or oxide, an oxi-nitride, a poly-oxide or other insulator material. In general, dielectric layer 106 forms an insulator layer for the gate stack once it is formed in subsequent process steps. In the described embodiment, the dielectric layer 106 is formed to be approximately one hundred and fifty Angstroms thick. One requirement for this gate dielectric layer is that it is able to withstand subsequent rapid thermal annealing (RTA) steps. For this reason, oxides work well for these purposes as opposed to high K materials that are ordinarily advantageous as gate dielectrics in scaled devices.

In the preferred embodiment of the invention, a first selective layer 108 is formed on top of dielectric layer 106 to have a thickness that is in the range of 1500 Angstroms to 2500 Angstroms. In the described embodiment, the first selective layer 108 is formed of a nitride ($N_2O$ or nitrous oxide). The first selective layer 108 is formed using a known technique, in the described embodiment the technique being a chemical vapor deposition step. After the first selective layer 108 has been formed, a patterned mask 110 is formed on top of first selective layer 108 to define the gate conductor and gate dielectric regions.

In one embodiment, the patterned mask 110 is formed by depositing a photoresist across the exposed surface of the first selective layer 108 and exposing it in a select pattern using a photolithography step. Then, the exposed portions of the photoresist are stripped in an ashing process. Of course, the patterned mask 110 may be formed using other techniques as well.

Figure 1B:
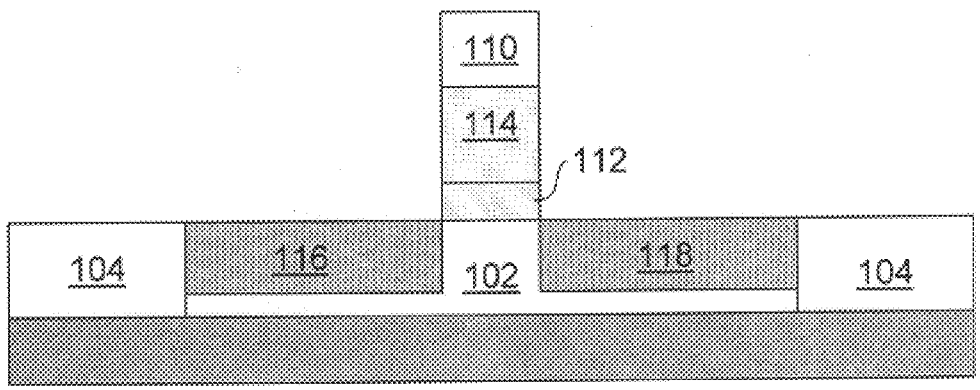

Referring now to FIG. 1B, it may be seen that portions of first selective layer 108 and the dielectric layer 106 not protected by patterned mask 110 have been removed in an etch step leaving a small portion of dielectric layer 106 and first selective layer 108 which will be referenced herein as dielectric layer 112 and first selective layer portion 114, respectively. In the described embodiment, the gate stack is scaled in width to the limits of photolithography (approximately 2000 Angstroms at the present time).

Continuing to refer to FIG. 1B, it may be seen that a dopant has been implanted into substrate 100 so as to form shallow source and drain regions 116 and 118, respectively. Additionally, as may be seen, the implantation of the dopant is performed at an energy level to only partially penetrate active region 102. Resultantly, the source and drain regions 116 and 118, respectively, are shallow and do not extend to the full depth of the active region 102 or to the depth of the isolation regions 104.

In the described embodiment of the invention, arsenic is implanted with an energy level that is in the range of 2 keV to 20 keV and a concentration level that is in the range of $2.0*10^{15}$ to $6.0*10^{15}$ to form the shallow source and drain regions. It is understood that the concentrations and implant energies may be varied. Advantageously, however, the sequence of steps disclosed herein allows for the creation of shallow junctions because a thinner metal conductor may be used. In general, gate conductors, especially polysilicon gate conductors, are formed to be the same thickness as the junctions. Accordingly, because metal gate conductors may be formed to be much thinner than polysilicon gate conductors, device junctions may also be formed to be relatively shallow. For example, if a polysilicon gate conductor is used, the gate conductor and the junctions are formed to result in a junction depth of at least 0.15 microns. Because metal gate conductors are being used herein, however, the junctions may be formed to have a thickness that is in the range of 0.02 microns to 0.08 microns. Even in a worst case, therefore, the resulting junctions that are formed when polysilicon gate conductors are used are at least twice as deep.

In the described embodiment, arsenic is used as a dopant to form an n-type device in a p-type substrate. Other dopants may also be used. For example, in an n-type substrate, Boron may be used to form p-channel devices. As is known by those skilled in the art, however, Boron tends to migrate more quickly than Arsenic because of its relative molecular size. Accordingly, this tendency of Boron must be accounted for when designing the process steps for forming the scaled devices according to the present invention and when considering the type of doping that is desired.

After the source and drain regions 116 and 118 have been formed through a doping step, the substrate 100 is subjected to a rapid thermal annealing (RTA) step. According to the preferred embodiment of the invention, the RTA step includes subjecting the substrate to a temperature in the range of 850 degrees Celsius to 1050 degrees Celsius for a period in the range of five to twenty seconds. One reason for this RTA step is to repair lattice damage to the silicon crystalline structure that potentially resulted from to implantation of the dopant. A second reason for the RTA step is to cause the active regions, also known as the junction, to be formed deeper within the substrate 100 by causing the implanted dopant to migrate into the active region 102. As may be seen, the channel formed as a result of the formed source and drain regions 116 and 118, respectively, extends, in FIG. 1C, to be the length of the first select layer portion 114.

Figure 1C:
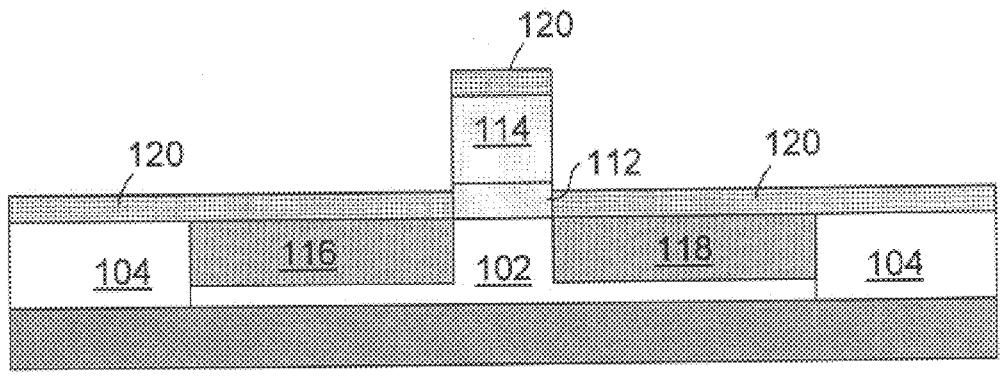

Referring now to FIG. 1C, it may be seen that the mask 110 has been removed and that a silicidation metal layer 120 has been formed on top of the surface of substrate 100. As is known by those skilled in the art, mask 110 may be removed through an ashing step. Any common method of forming metal layers including CVD, sputtering and plasma deposition may be used to form the silicidation metal layer 120 on top of substrate 100.

In the preferred embodiment of the invention, a layer of cobalt 120 is deposited thereon in a sputtering step and is formed to have a thickness in the range of 75 Angstroms to 300 Angstroms. The sputtering step is performed in an ambient of inert atoms. For example, in the described embodiment, argon or xenon may be used as to form the inert ambient. Alternatively, a pure nitrogen ambient can also be used. Nitrogen is not, however, ordinarily preferred. Hydrogen also is not preferred because it can make the film too insulative. Other silicidation metals that may be used include platinum, titanium and nickel.

Figure 1D:
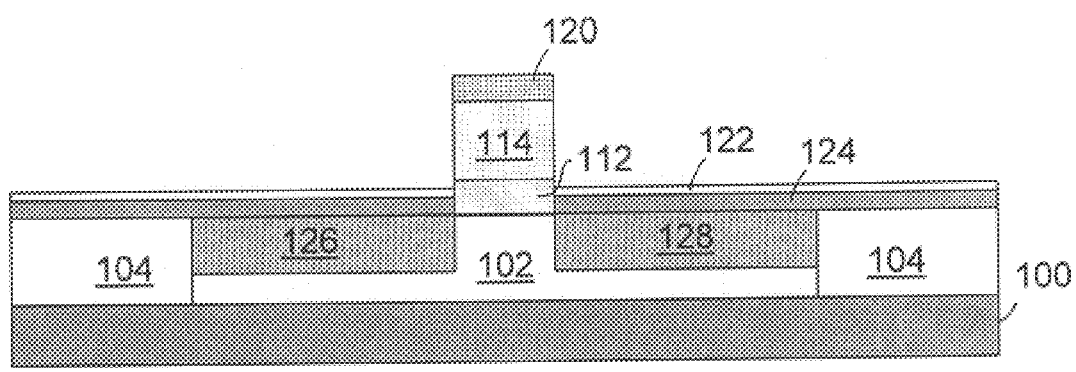

Referring now to FIG. 1D, substrate 100 may be seen after it has been subjected to a second RTA step having a temperature in the range of 675 degrees Celsius to 750 degrees Celsius for a period of approximately thirty seconds in a pure nitrogen environment. This second RTA step causes the cobalt layer 120 to react with the underlying silicon to form a salicide (CoSi). As may be seen, the majority of the cobalt is converted to the salicide CoSi. Accordingly, a thinner cobalt layer 122, a salicide layer 124 and a thinner source and drain regions 126 and 128 result from the second RTA step.

Figure 2A:
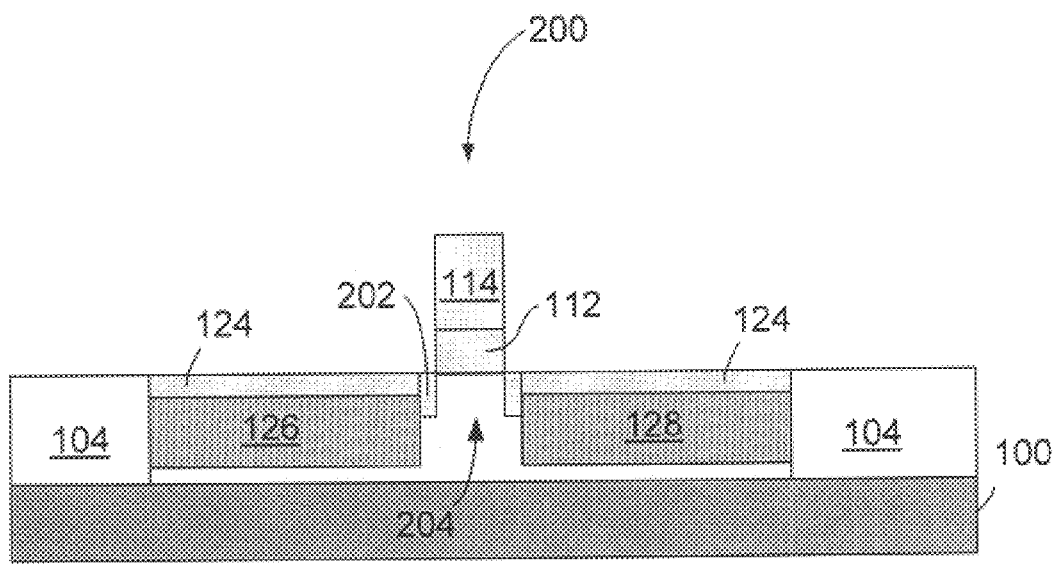
FIGS. 2A through 2D are partial cross sectional views of the semiconductor substrate of FIGS. 1A through 1D illustrating the formation of transistors according to the present invention during subsequent formation steps.

Referring now to FIG. 2A, it may be seen that the thinner cobalt layer 122 has been removed from substrate 100. Cobalt layer 122 may be removed through a common RTA strip step. For example, it may be stripped in a mixture containing water, peroxide and ammonium fluoride in a 7:1:1 ratio, respectively, at room temperature.

Additionally, as may be seen, the gate stack shown generally at 200 has been subjected to an isotropic etch to reduce the width and height of the gate stack 200. Additionally, as is shown, LDD regions 202 have been formed within the channel region 204.

Reducing the gate stack 200 width in the etch step allows the LDD 202 regions to be formed in a subsequent step in the portions of the channel 204 that are no longer covered by the gate stack 200. Accordingly, this isotropic etch step not only allows for a narrower gate stack 200 to be formed, but also allows the underlying channel length of channel 204 to be shortened. Accordingly, if the original width of the gate stack and corresponding channel length are made to be as small as modern lithographic process steps allow, this subsequent isotropic etch step allows for even further scaling in the size of the gate stack and the channel length.

Approximately 500 Angstroms of the height of the first selective layer portion 114 are removed during the isotropic etch. For the embodiment shown, this etch step further includes an etch step that is selective to the dielectric layer 112 to partially remove it as well so as to expose the portion of channel 204 in which the LDD regions 202 are then formed.

After the isotropic etch step is performed as described above, LDD regions 202 are formed in the exposed portions of channel 204 by implanting a dopant therein with a light concentration as is known by those skilled in the art. For example, the LDD regions can be formed by implanting arsenic with an implant energy of 1 keV to 8 keV and a concentration of $6.0*10^{14}$ to $3.0*10^{15}$. In an alternative embodiment, antimony is implanted instead of arsenic to form the LDD regions.

After the dopant is lightly implanted to form the LDD regions, substrate 100 is subjected to a slight annealing step to passivate (activate) the silicon structure after the dopant is implanted into substrate 100 to form the LDD regions 120. More specifically, the substrate is annealed at a temperature in the range of 600 degrees Celsius to 800 degrees Celsius for a period in the range of 10 to 20 seconds. In an alternate method, the LDD regions may be formed merely by subjecting the substrate 100 to an annealing step to cause the impurities of the source and drain regions 202 to migrate into the channel 204. The method employed depends in part on the type of impurity within the source and drain regions 116 and 118.

Figure 2B:
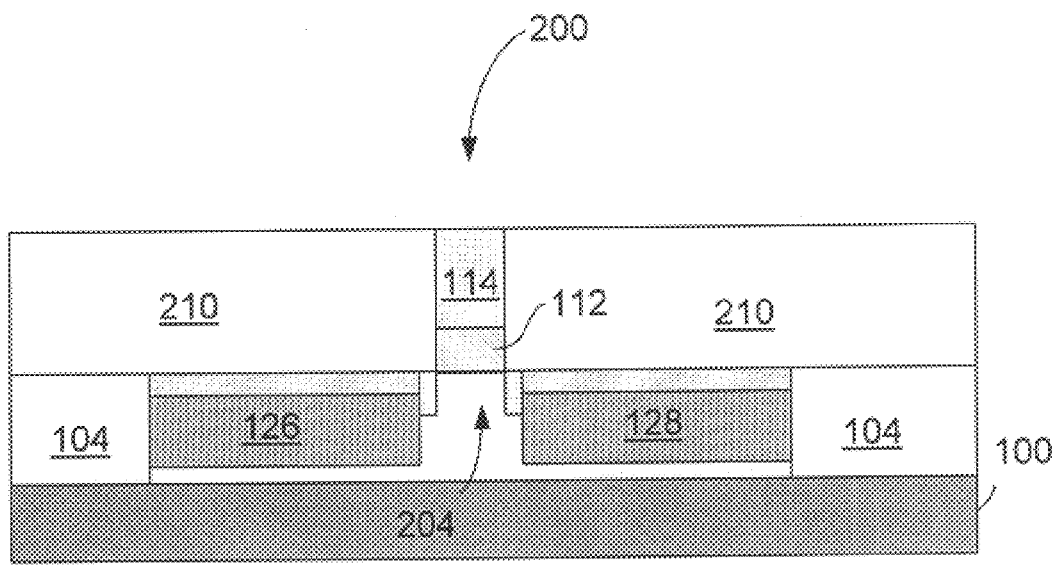

Referring now to FIG. 2B, a second selective layer 210 is formed across the top surface of substrate 100. In the described embodiment, the second selective layer 210 is formed of an oxide. The second selective layer 210 of the described embodiment of FIG. 2B is deposited in a TEOS step and formed to a thickness in the range of 4000 Angstroms to 8000 Angstroms. Thereafter, the substrate 100 is subjected to a chemical-mechanical polish ("CMP") process.

CMP is a well-known inter level removal process used for its ability to planarize the resulting surface. CMP combines chemical etching and mechanical buffing to remove raised features on a surface of a semiconductor wafer. In a typical CMP process, a semiconductor wafer is mounted on a rotating holder and lowered onto a rotating surface flooded with a mild etching solution, generally defined as a silica slurry. The etching grows a thin layer on the exposed wafer surface that is almost simultaneously removed by the buffing action. The net effect is a very controlled polishing process capable of almost complete flatness. The CMP process step is performed until the second selective layer 210 is sufficiently removed to be flush with the top surface of the first selective layer portion 114.

One requirement for the second selective layer 210 is that it is chemically selective relative to the first selective layer portion 114. Accordingly, in an alternate embodiment, first selective layer portion 114 may be formed out of an oxide instead and second selective layer 210 may be formed of a nitride. Primarily, these two layers should be formed to be chemically selective to each other so that either layer may be removed while the other remains in a subsequent processing step.

Figure 2C:
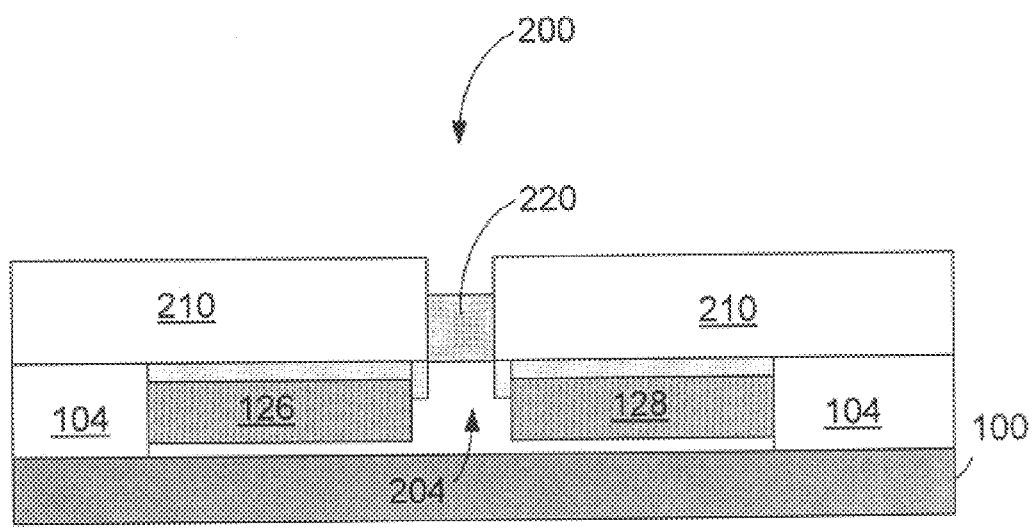

Referring now to FIG. 2C, it may be seen that the first selective layer portion 114 has been selectively removed in an etch step while the second selective layer 210 remains. As may also be seen in FIG. 2B, dielectric layer 112 has been removed in an etch step and has been replaced by a gate insulator layer 220. The gate insulator layer 220 is formed, in the preferred embodiment, out of a high K material, namely, a high K oxide, nitride or nitrogen bearing oxide. Alternatively, rather than completely removing dielectric layer 112, it may be partially removed prior to the addition of the gate insulator layer 220 as shown in FIG. 2D.

Figure 2D:
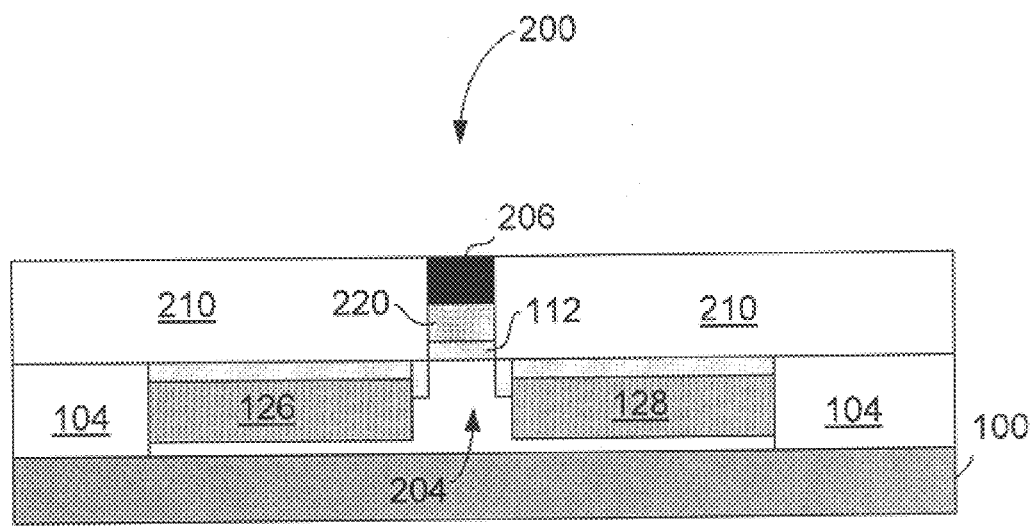

Referring now to FIG. 2D, it may be seen that a metal gate conductor 206 has been deposited on top of the gate insulator layer 220. Additionally, FIG. 2D illustrates the alternate embodiment discussed above in relation to FIG. 2C wherein the dielectric layer 112 is only partially removed and a high K gate insulator material is formed thereon. In this embodiment, the remaining oxide is approximately fifteen to twenty five Angstroms thick. In yet another alternate embodiment of the invention, the metal gate contact is merely formed on top of the dielectric layer 112 without the addition of a high K material.

The metal gate conductor 206 may be formed on substrate 100 in any of the known techniques for forming metal layers (e.g., sputtering or CVD with a subsequent CMP process step for smoothing the metal layer or for reducing the metal layer to a desired level). For the present invention, satisfactory metals for the gate contact/conductor include Titanium (Ti), Titanium Nitride (TiN), Aluminum (Al) or Tungsten (W).

Figure 3:
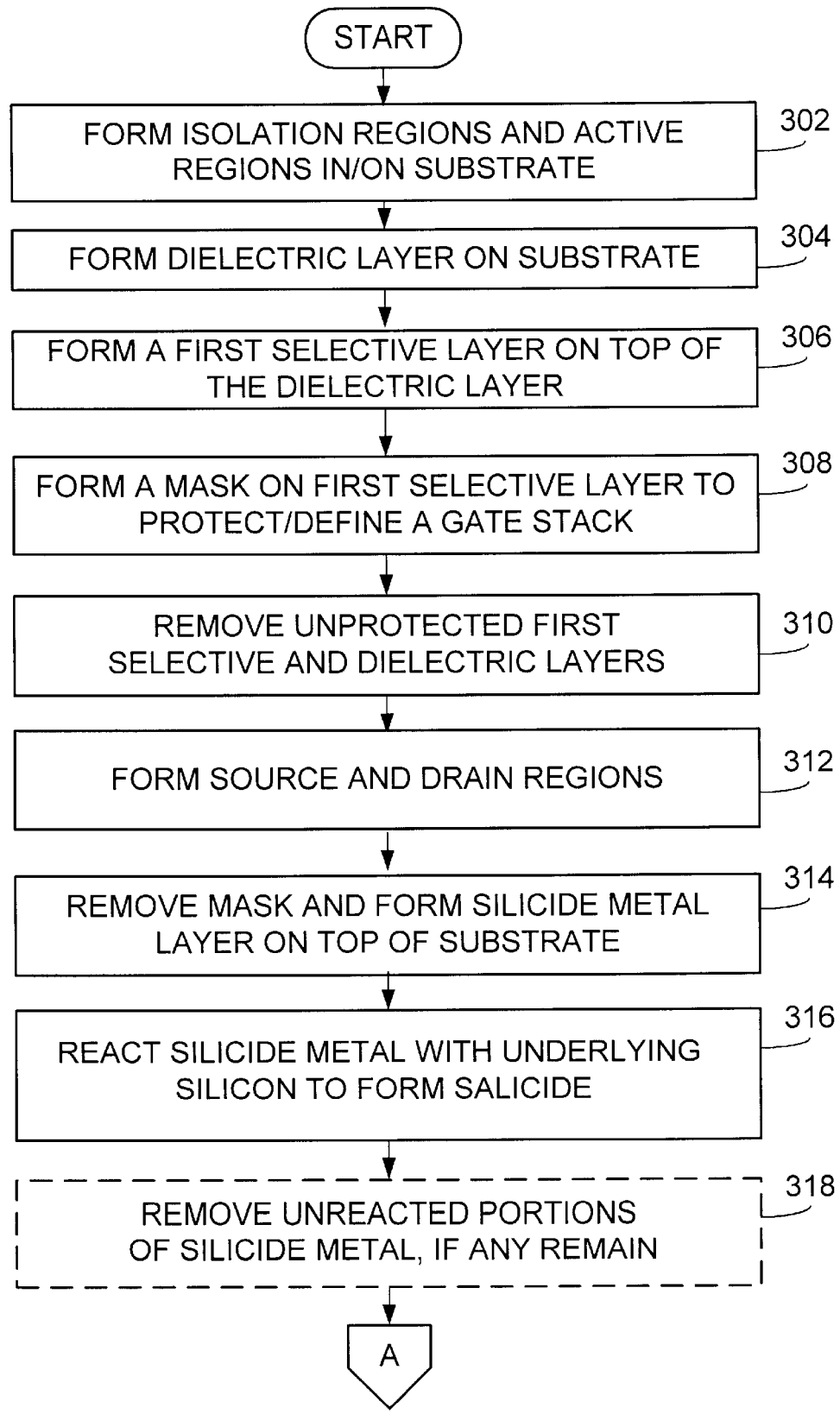
FIG. 3 is a flow chart illustrating a first series of steps of a method for forming a transistor upon a semiconductor substrate according to the present invention.
Figure 4:
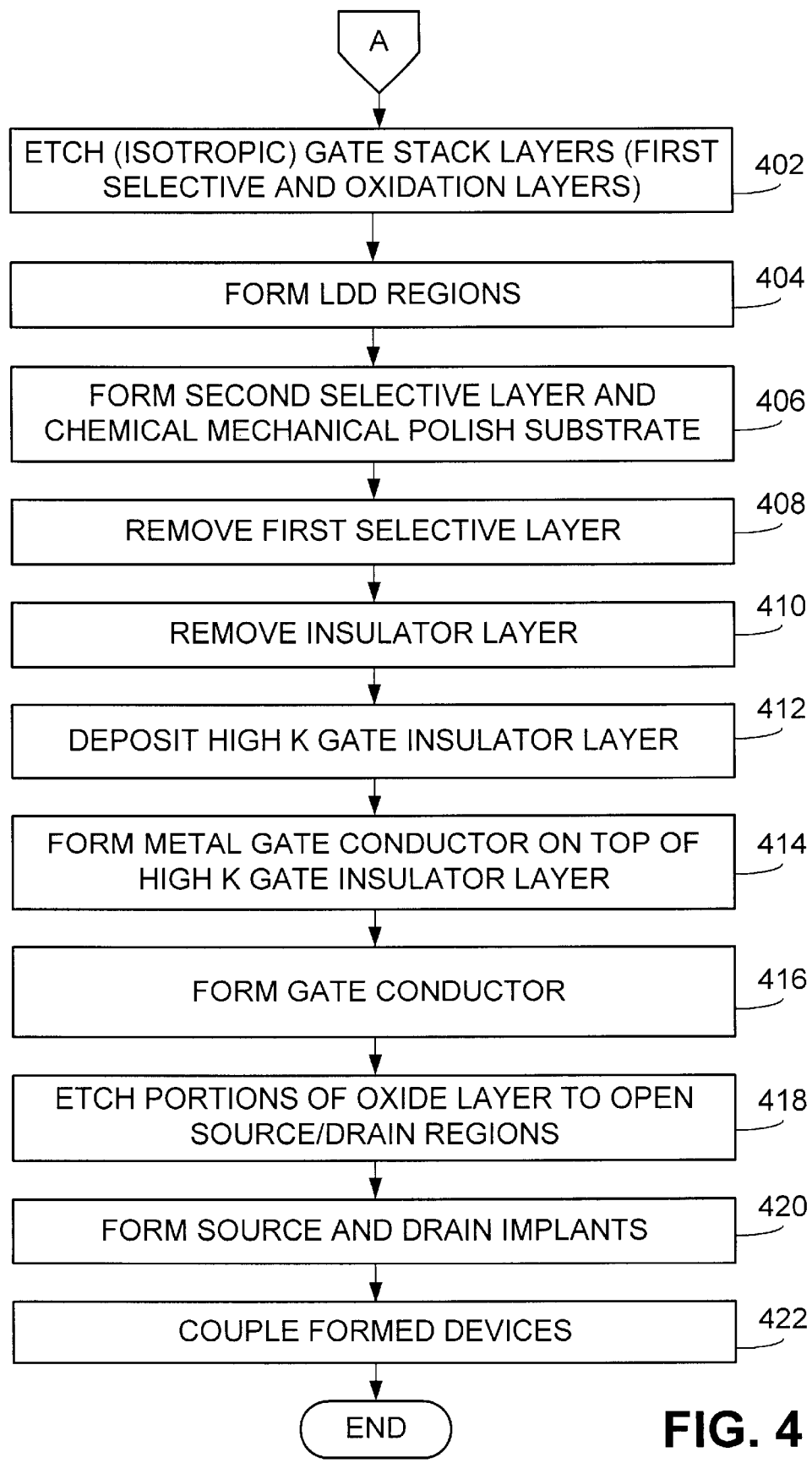
FIG. 4 is a flow chart illustrating a second series of steps of a method for forming a transistor upon a semiconductor substrate according to the present invention.

FIG. 3 is a flow chart illustrating a first series of steps of a method for forming a transistor upon a semiconductor substrate according to the present invention. In FIGS. 3 and 4, a process for forming an n-channel device in a p-type substrate is described (or in a p-type well formed in an n-type substrate). Alternatively, the process of forming a p-channel device in an n-type substrate (or in an n-type well formed in a p-type substrate) may be accomplished using similar steps but with different doping types.

Referring now to FIG. 3, isolation regions 104 and active regions 102 are formed in/on the substrate 100 of FIGS. 1A–1D (step 302). The active region 102 is a semiconductive region in which an active device may be formed and is one of a great number of active regions that are formed to create an integrated circuit. The isolation regions 104 are formed of an insulating material that serves to isolate active devices or conductive components from other active devices or conductive components. For silicon-based semiconductor circuits, the isolation regions 104 are typically formed of silicon dioxide. The isolation regions 104 may be formed using the well-known LOCOS growth process, trenching and filling steps or another process for forming isolation regions. In general, the invention herein includes all methods of creating isolation regions.

Continuing to refer to FIG. 3, an oxidation dielectric layer 106 of FIG. 1 is formed on top of the substrate (step 304). The dielectric layer is deposited or grown to have a thickness of approximately 150 Angstroms and may be formed out of a thick oxide, a nitride or an oxi-nitride. Other known insulator materials may also be used.

After the dielectric layer 106 of FIG. 1 is formed on top of substrate 100, a first selective layer 108 is formed on top of dielectric layer 106 (step 306). In the described embodiment of the invention, the first selective layer comprises nitride ($N_2O$ or nitrous oxide). In an alternative embodiment, however, an oxide or other similar composition may be used.

The first selective layer is formed to have a thickness in the range of fifteen hundred to twenty five hundred Angstroms. The first selective layer may be formed thereon using any known technique. In the described embodiment, the first selective layer is formed thereon through a chemical vapor deposition (CVD) step.

A patterned photoresist mask 110 of FIG. 1 is then formed on top of the first selective layer (step 308). The mask is patterned to protect the regions of the substrate where the gate stacks are to be formed. After the formation of the patterned photoresist mask, the unprotected portions of the substrate are etched to remove the unprotected portions of the first selective layer 108 and the dielectric layer 106 (step 310). In the described embodiment, an isotropic etching step is used to produce a scaled gate stack that is smaller than photolithographic resolutions allow (approximately 2000 Angstroms).

After portions of the dielectric layer 112 are removed through an etch step, the substrate active and isolation regions 102 and 104, respectively, are exposed once again in the areas not protected by the patterned photoresist mask 110. Accordingly, the source and drain regions are formed in the active portions of the substrate 100 (step 312). In the described embodiment, shallow source and drain regions 116 and 118, respectively, are formed by implanting a dopant. Specifically, arsenic is implanted into a p-type substrate to create an n-channel device with an implant energy level that is in the range of 2 keV to 20 keV and a concentration level that is in the range of $2.0*10^{15}$ to $6.0*10^{15}$ to form the shallow source and drain regions.

After the source and drain regions 116 and 118 have been formed, the substrate is annealed in an RTA step at a temperature in the range of eight hundred fifty degrees Celsius to one thousand and fifty degrees Celsius for a period in the range of five to twenty seconds. Thereafter, photoresist mask 110 is removed and a salicidation metal layer 120 is formed on top of substrate 100 (step 314). In the described embodiment, metal layer 120 is deposited in a sputtering step and comprises cobalt. Other silicidation metals that may be used include platinum, titanium and nickel.

The sputtering is performed in an ambient of inert atoms. For example, in the described embodiment, argon or xenon may be used. Alternatively, a pure nitrogen ambient can be used. Nitrogen is not, however, ordinarily preferred. Hydrogen also is not preferred because it can make the film too insulative.

After being deposited on substrate 100, the silicidation metal layer 120 is reacted in an annealing step having a temperature in the range of six hundred seventy five degrees Celsius to seven hundred and fifty degrees Celsius for a period of approximately thirty seconds with the underlying silicon of substrate 100 to form a salicide layer 122 (step 316).

Sometimes, not all of the metal layer 120 reacts with the silicon to form the salicide layer 122. Accordingly, a thin metal layer 124 may remain after the salicidation step. The thin metal layer 124 is, in turn, removed in an etch step (step 318). In other cases, however, all of the silicide metal reacts with the underlying silicon in a 1:2 ratio (metal to silicon). Factors such as the original silicide metal thickness and the duration of the annealing step determine whether all of the silicide metal reacts to form the salicide.

FIG. 4 is a flow chart illustrating a second series of steps of a method for forming a transistor upon a semiconductor substrate according to the present invention. Referring now to FIG. 4, the first selective layer 114 and the gate dielectric layer 112 are isotropically etched wherein a portion of the first selective layer 114 is removed from the top as well as on the sides (step 402). As a result, a portion of the undoped active region becomes exposed. Thereafter, a pair of lightly doped regions (LDD) regions are formed (step 404) in the exposed portion of the active region (channel region). In the described embodiment of the invention, the LDD regions are formed by implanting dopant with a relatively low implant energy and with a light concentration.

In an alternate embodiment, the LDD regions may be formed in an annealing step wherein some of the impurities from the source and drain regions 126 and 128 migrate into the channel. In the described embodiment, however, the LDD regions are implanted. Accordingly, an annealing step is performed thereafter so as to repair crystalline damage that may have occurred from the implant step.

In another alternate embodiment of the inventive method, the isotropic etch step and the LDD formation steps (steps 402 and 404) may be performed prior to the salicidation steps (steps 314, 316 and 318). In this embodiment, the LDD regions should be formed to a depth of at least 200 Angstroms. LDD regions that are at least 200 Angstroms should have a sufficient depth for the described embodiment of the inventive method to avoid being totally consumed in the subsequent salicidation steps.

To illustrate, if a cobalt layer is deposited to have a thickness of seventy five Angstroms, one hundred fifty Angstroms of silicon will be consumed. Accordingly, if the LDD regions and source and drain regions are formed to be two hundred Angstroms deep, fifty Angstroms of LDD region and source and drain regions will remain below the salicide layer after the salicidation step if the metal layer is formed to be seventy five Angstroms.

After the salicidation steps and the LDD regions are formed, a second selective layer 210 is formed on the surface of substrate 100 (step 406). The second selective layer 210 is selective relative to the first selective layer 114. A selective material is one that requires different wet etch chemicals in an etch step. This allows the choice of which material is etched as a result of the choices made in selecting the wet etch chemicals.

The second selective layer 210 is then polished in a CMP process step until the second selective layer 210 and the first selective layer have top surfaces that are planar relative to each other. Stated differently, the second selective layer 210 is polished until the first selective layer is exposed. Thereafter, the first selective layer is removed (step 408).

In the described embodiment, the first selective layer 114 comprises a nitride and the second selective layer 210 comprises an oxide. In an alternate embodiment, the first selective layer comprises an oxide and the second selective layer comprises a nitride. Other elements or compositions may be used so long as the first and second layers are selective relative to each other.

After the first selective layer 114 is removed, at least a part of the dielectric layer 112 is removed (step 410). In the described embodiment, the insulative layer is removed in an HF bath having a ten to one ratio, respectively. In one embodiment, all of the dielectric layer 112 is removed. In another alternate embodiment, only some of the dielectric layer 112 is removed. In this embodiment, fifteen to twentyfive Angstroms are allowed to remain. In yet another embodiment, step 410 is skipped and none of the insulative layer is removed.

After at least some of the dielectric layer 112 is removed, or after step 408 if step 410 is skipped, a nitride or high K material layer 220 is deposited to form at least a part of the gate insulator (step 412). If all of the dielectric layer 112 was removed in step 410, then the high K material layer 220 solely forms the gate insulator. If only some of the gate dielectric layer 112 is removed, then the remaining portion of layer 112 and high K material layer 220 jointly form the gate insulator.

Once the high K material layer 220 is formed on substrate 100 as a part of the gate insulator, a metal gate conductor is formed on top of the high K material layer (step 414). In the described embodiment, the metal gate conductor is formed in a sputtering step (step 416). Thereafter, the deposited metal is removed everywhere except from the gate stack in a chemical-mechanical polish step.

At this point, the device formation is complete. Accordingly, the remaining steps are for connecting the device to the integrated circuit being formed on the substrate. Connecting the device to the other component of the integrated circuit includes etching portions of the second selective layer 210 to create an aperture for forming conductive traces to the source and drain region 126 and 128 (step 418). Then, source and drain implants are formed (step 420). Finally, the device is coupled to other circuitry and/or devices on the integrated circuit (step 422).

Figure 5:
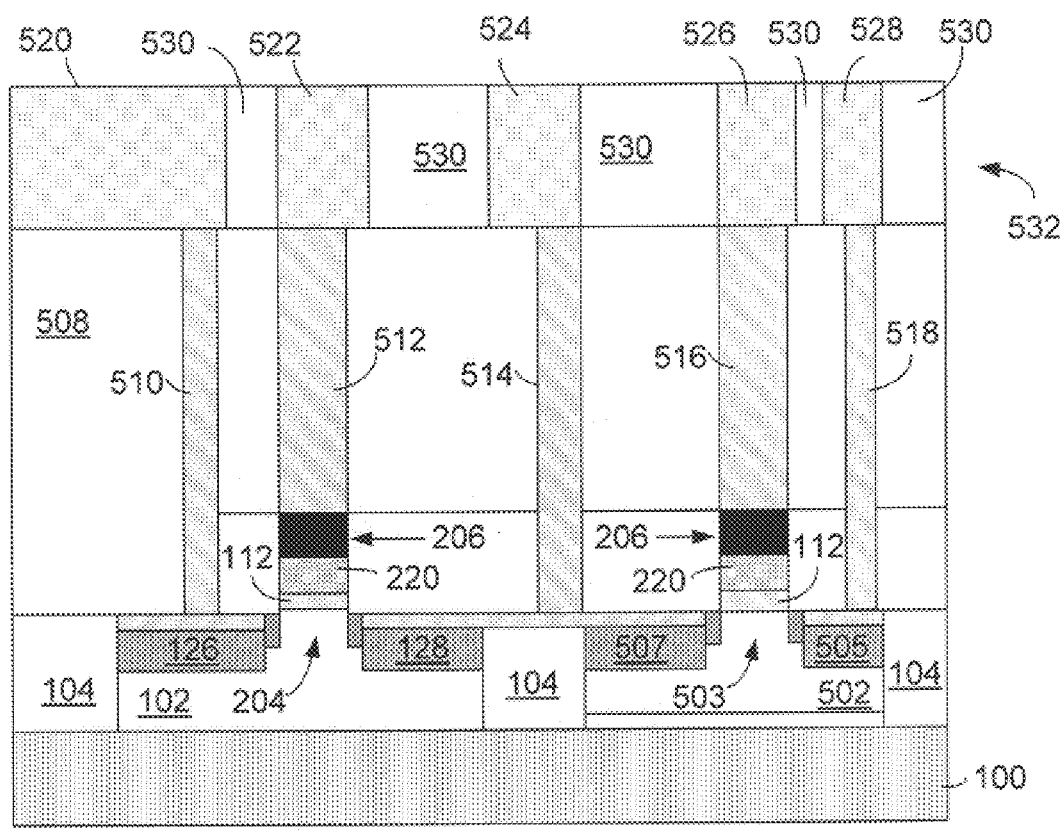
FIG. 5 is a partial cross sectional diagram according to the present invention illustrating the components of a transistor and how it can be connected to other devices of an integrated circuit.

FIG. 5 is a partial cross sectional diagram according to the present invention illustrating the components of a transistor and how it can be connected to other devices of an integrated circuit. Referring now to FIG. 5, each of the components as discussed previously includes the part numbers used to introduce the components. As may be seen, FIG. 5 illustrates a complementary metal oxide (CMOS) transistor pair formed in a p-type substrate. Accordingly, to form an p-channel device, a well 502 is formed to create n-type substrate for the p-channel device.

Residing below the gate stack of each transistor is the channel 204 and a channel 503 of the CMOS transistor pair described above that is formed according to the methods generally described herein. As may also be seen in FIG. 5, the p-channel device includes source and drain regions 126 and 128, respectively, while the n-channel device includes source and drain regions 505 and 507, respectively. Additionally, drains 128 and 507 are each connected to vias 514 in the embodiment shown in FIG. 5.

In coupling the CMOS transistor pair to other transistors and other devices in an integrated circuit, an insulation layer 508 is formed in a CVD process upon the transistor and other portions of the substrate at a thickness that is required to isolate a first metallization layer 532 of the device of FIG. 5 from transistors and other devices of the integrated circuit.

Typically, the insulation layer 508 is polished in a CMP process to form a planar upper surface. It is then masked and etched to form openings to the active regions of the transistors (e.g., source 128, drain 126 and gate conductor 206).

Once the openings are formed, a sputtering, deposition or evaporation process, by way of example, is used to fill the vias with a metal. The resulting metallized vias 510, 512, 514, 516 and 518 are formed. Metals that can be used in this process include Ti, TiN, W and Al. The vias 510 through 518 may be deposited in a same step that forms metallization layer 532. The metallization layer 532 is then masked to form a conductor pattern and is etched back to the insulation layer 508 to form the conductors 520, 522, 524, 526 and 528. An insulation layer 530 may be formed to isolate conductive paths 520 through 528 in metallization layer 532, particularly if a subsequent metallization layer is formed upon the metallization layer 532. Subsequent metallization layers (not shown) can provide further interconnections between the devices and external to the formed integrated circuit.

In an alternate embodiment of the invention, gate conductor 206 is formed as a part of the steps of forming the vias of the integrated circuit. This step is made possible by the prior formation of the second selective layer and the removal of the first selective layer.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:

1. A method for forming a transistor in an active region of a substrate, the method comprising:
    forming a gate stack on the active region of the substrate, comprising the steps of:
        forming an insulative layer;
        forming a first selective layer on top of the insulative layer;
        forming a photoresist mask on top of the first selective layer; and
        removing portions of the insulative layer and the first selective layer unprotected by the photoresist mask to form the gate stack, wherein the gate stack defines a channel region;
    doping the substrate to form source and drain regions adjacent the gate stack, wherein the gate stack protects the channel region from the doping;
    forming a salicide layer on the top surface of the source and drain regions;
    isotropically etching the gate stack to reduce the width of the gate stack;
    forming a second selective layer on the substrate wherein the second selective layer surrounds the gate stack; and
    replacing the gate stack with a dielectric gate insulator and a metal gate conductor, wherein the second selective layer protects the source and drain regions during formation of the metal gate conductor.

2. The method of claim 1 wherein replacing the gate stack includes removing the first selective layer and all of the insulative layer.

3. The method of claim 1 wherein replacing the gate stack includes removing the first selective layer and at least a part of the insulative layer.

4. The method of claim 1 wherein replacing the gate stack includes the step of forming a metal in the space from which the first selective layer and at least a part of the insulative layer were removed.

5. The method of claim 1 further comprising the step of forming LDD regions within the channel region.

6. The method of claim 1 wherein the first selective layer is formed of a nitride and the second selective layer is formed of an oxide.

7. The method of claim 1 wherein the first selective layer is formed of an oxide and the second selective layer is formed of a nitride.

8. The method of claim 1 wherein the step of forming a salicide layer includes:
    depositing a metal on the top surface of the substrate in a sputtering step;
    reacting the metal with the underlying silicon; and
    if any of the metal remains in an unreacted state after the reacting step, removing unreacted portions of the metal.

9. The method of claim 8 wherein the metal has a thickness that is greater than or equal to 75 Angstroms.

10. The method of claim 8 wherein the metal has a thickness that is equal to or less than 300 Angstroms.

11. The method of claim 8 wherein the metal comprises one of cobalt, platinum, titanium or nickel.

12. The method of claim 8 wherein the step of reacting the metal with the underlying silicon includes a rapid thermal annealing (RTA) step.

13. The method of claim 12 wherein the RTA step includes annealing the substrate at a temperature that exceeds 650 degrees Celsius.

14. The method of claim 12 wherein the RTA step includes annealing the substrate at a temperature that is less than 750 degrees Celsius.

15. The method of claim 12 wherein the RTA step includes annealing the substrate in a pure Nitrogen ambient.

16. The method of claim 8 wherein the step of replacing the first selective layer with a metal occurs after all RTA steps have been completed.

17. The method of claim 1 wherein the width of the gate stack is made to a minimum width as limited by photolithographic resolution.

18. The method of claim 1 wherein isotropically etching the gate stack also reduces the height of the gate stack.

19. The method of claim 18 wherein LDD regions are formed in a channel region that is at least partially exposed by the gate stack after the isotropic etch step.

20. A method for forming an integrated circuit on a substrate, the method comprising:
    forming a plurality of isolation regions, wherein the plurality of isolation regions define a plurality of active regions;
    forming a transistor in each of a plurality of active regions on the substrate by:

forming a gate stack on the active region of the substrate, comprising the steps of:
  forming an insulative layer;
  forming a first selective layer on top of the insulative layer;
  forming a photoresist mask on top of the first selective layer; and
  removing portions of the insulative layer and the first selective layer unprotected by the photoresist mask to form the gate stack, wherein the gate stack defines a channel region of the transistor;
  doping the substrate to form source and drain regions adjacent the gate stack,
wherein the gate stack protect the channel region of the transistors from the doping;
  forming a salicide layer on the top surface of the source and drain regions;
  isotropically etching the gate stack to reduce the width of the gate stack;
  forming LDD regions in portions of the channel region corresponding to the reduced width of the gate stack;
  forming a second selective layer on the substrate wherein the second selective layer surrounds the gate stack; and
  replacing the gate stack with a dielectric gate insulator and a metal gate conductor, wherein the second selective layer protects the source and drain regions during formation of the metal gate conductor; and
interconnecting the plurality of transistors to form the integrated circuit.

21. The method of claim 20 wherein replacing the gate stack includes removing the first selective layer and all of the insulative layer.

22. The method of claim 20 wherein replacing the gate stack include s removing the first selective layer and at least a part of the insulative layer.

23. The method of claim 20 wherein replacing the gate stack includes the step of forming a metal in the space from which the first selective layer and at least a part of the insulative layer were removed.

24. The method of claim 20 wherein the first selective layer is formed of a nitride and the second selective layer is formed of an oxide.

25. The method of claim 20 wherein the first selective layer is formed of an oxide and the second selective layer is formed of a nitride.

26. The method of claim 20 wherein the step of forming a salicide layer includes:
  depositing a metal on the top surface of the substrate in a sputtering step;
  reacting the metal with the underlying silicon; and
  if any of the metal remains in an unreacted state after the reacting step, removing unreacted portions of the metal.

27. The method of claim 26 wherein the metal has a thickness that is greater than or equal to 75 Angstroms.

28. The method of claim 26 wherein the metal has a thickness that is equal to or less than 300 Angstroms.

29. The method of claim 26 wherein the metal comprises one of cobalt, platinum, titanium or nickel.

30. The method of claim 26 wherein the step of reacting the metal with the underlying silicon includes a rapid thermal annealing (RTA) step.

31. The method of claim 30 wherein the RTA step includes annealing the substrate at a temperature that exceeds 650 degrees Celsius.

32. The method of claim 30 wherein the RTA step includes annealing the substrate at a temperature that is less than 750 degrees Celsius.

33. The method of claim 30 wherein the RTA step includes annealing the substrate in a pure Nitrogen ambient.

34. The method of claim 30 wherein the width of the gate stack is made to a minimum width as limited by photolithographic resolution.

* * * * *